United States Patent [19]

Kuchy

[11] 4,158,843
[45] Jun. 19, 1979

[54] AUTOMATIC DIRECTION FINDER ANTENNA PREAMPLIFIER PROCESSOR

[75] Inventor: Ray W. Kuchy, Ft. Lauderdale, Fla.

[73] Assignee: The Bendix Corporation, Southfield, Mich.

[21] Appl. No.: 871,311

[22] Filed: Jan. 23, 1978

[51] Int. Cl.² ............................ G01S 3/00; H03F 3/45
[52] U.S. Cl. ............................... 343/113 R; 343/119; 340/6 R; 330/264
[58] Field of Search ................ 343/113 R, 119, 124, 343/120; 330/264, 265, 271, 269, 253; 340/6 R

[56] References Cited

U.S. PATENT DOCUMENTS

| | | | |
|---|---|---|---|
| 2,214,342 | 9/1940 | Neufeld | 343/119 |
| 3,778,834 | 12/1973 | Poppe et al. | 343/119 |
| 3,795,000 | 2/1974 | Bell, Jr. et al. | 343/113 R |
| 3,898,576 | 8/1975 | Fukaya | 330/253 |
| 3,922,614 | 11/1975 | van de Plassche | 330/253 |
| 3,922,634 | 11/1975 | Warner | 340/6 R |
| 3,935,575 | 1/1976 | Leisterer et al. | 343/113 R |
| 4,000,474 | 12/1976 | Todokoro | 330/264 |
| 4,003,060 | 1/1977 | Broce et al. | 343/113 PT |
| 4,087,817 | 5/1978 | Sawicki et al. | 343/117 R |

FOREIGN PATENT DOCUMENTS 649338 1/1951 United Kingdom ............... 343/120

OTHER PUBLICATIONS

John Markus, *Guidebook of Electronic Circuits,* pp. 12, 14, McGraw-Hill, 1974.

*Primary Examiner*—Maynard R. Wilbur
*Assistant Examiner*—Lawrence Goodwin
*Attorney, Agent, or Firm*—W. G. Christoforo; Bruce L. Lamb

[57] ABSTRACT

A relatively small directional loop antenna adapted for use in an airborne automatic direction finder (ADF) is made to perform like a physically larger loop while being broadly tuned to a mean operating frequency. The total input equivalent noise source is kept low by coupling the loop into an impedance comprised of an active circuit. The active circuit is designed in conjunction with an active feedback circuit into which the ADF sense antenna is fed to maintain a relatively constant phase difference between the ADF loop and sense signals.

1 Claim, 3 Drawing Figures

AUTOMATIC DIRECTION FINDER ANTENNA PREAMPLIFIER PROCESSOR

BACKGROUND OF THE INVENTION

This invention relates to antennas for use in airborne automatic direction finding (ADF) equipment and particularly to such antennas which are relatively small but whose electrical characteristics are similar to those antennas which are relatively large.

Modern automatic radio direction finders for aircraft use an antenna which is fixed to the skin of the aircraft and which includes what are known as loop and sense elements. In this description the word "loop" is used to describe different elements in various arts. Specifically, in the ADF art, a loop element or antenna is a type of radiated signal responsive circuit which provides a portion of the signal input into ADF receiver. In the antenna art, specifically, a loop is a closed electrical circuit usually comprised of one or more turns of copper wire and which responds directionally to intercepted electromagnetic radiations. The ADF loop element or antenna is generally comprised of two orthogonally placed loops. Specifically, the ADF loop element comprises two mutually perpendicular electrical windings on a ferrite form or forms. The amplitudes of the signals induced in the various windings by an electromagnetic field of the type radiated by radio broadcast stations is dependent upon the orientation of the loop elements with respect to the broadcast station. By considering the amplitudes of the induced signals, the direction of the broadcast station from the loop elements can be ascertained with a 180 degree ambiguity. The ADF antenna also includes an omnidirectional sense antenna which provides phase information to resolve the ambiguity.

A generally larger loop was previously needed to obtain a sufficient signal-to-noise ratio over the ADF operating range, which at the present time lies between 200 kilohertz to 1.8 megahertz, since the signal-to-noise ratio is a function of the equivalent effective height of the loop and the noise generated by the circuit connected to the loop.

In known ADF the signals from the two loop antenna windings are modulated by a low frequency local signal and combined to produce a composite loop signal. This signal is added to the signal from the sense antenna, the new signal comprising the directional information. This signal can be demodulated to provide the directional information by various means known to those skilled in the art and which do not comprise a portion of the present invention. For example, a coherent demodulator for extracting the directional information from the combined signal was described in a patent application entitled "Coherent Demodulator" by Joseph J. Sawicki, having Ser. No. 805,676, now U.S. Pat. No. 4,135,191, issued Jan. 16, 1979, and filed June 13, 1977.

It is important in preserving the direction information, when the sense and loop signals are added, that these signals have a relatively constant phase difference of 90 degrees over the ADF operating frequency range.

SUMMARY OF THE INVENTION

In the present invention relatively small loop windings are used in an ADF loop antenna for electromagnetic field pickup. The relatively small loop windings are operated at a low Q and broadly tuned to the ADF mean operating frequency. The low Q figure is obtained by operating the loop windings into active impedance circuits, while the loop winding signal-to-noise ratios are maintained low, by making the active circuits comprised, in the embodiment to be described, of push-pull JFET preamplifiers which provide through the judicious use of feedback circuits, the proper impedance for the loop windings.

In addition to the above, the transfer function of the circuit into which the ADF sense antenna operates is arranged to have a phase shift, across the frequency band of interest, which is the complement of the phase shift of the transfer function of the above mentioned JFET push-pull preamplifiers into which the loop windings are operated so that there is generally a constant 90 degree phase difference between the ADF loop element signal and the sense element signal so that these two signals can be properly combined for easy distortion-free transmission to the ADF receiver, which is usually remotely located from the ADF antenna and its associated circuits.

It is an object of this invention to provide a loop antenna means for an airborne automatic direction finding equipment which is relatively small but which has the signal-to-noise characteristics of a larger loop antenna at the lowest operating frequencies.

It is another object of this invention to provide a loop antenna means of the type described, which has a good signal-to-noise ratio.

A further object of this invention is to provide a loop antenna of the type described which has a relatively low Q but which operates effectively.

One more object of this invention is to provide a loop antenna which operates into a circuit whose thermal noise factor is low.

These and other objects of the invention will become apparent to one skilled in the art from a reading and understanding of the below description of the preferred embodiment and the appended claims.

DESCRIPTION OF THE PREFERRED EMBODIMENT

Figure 1:
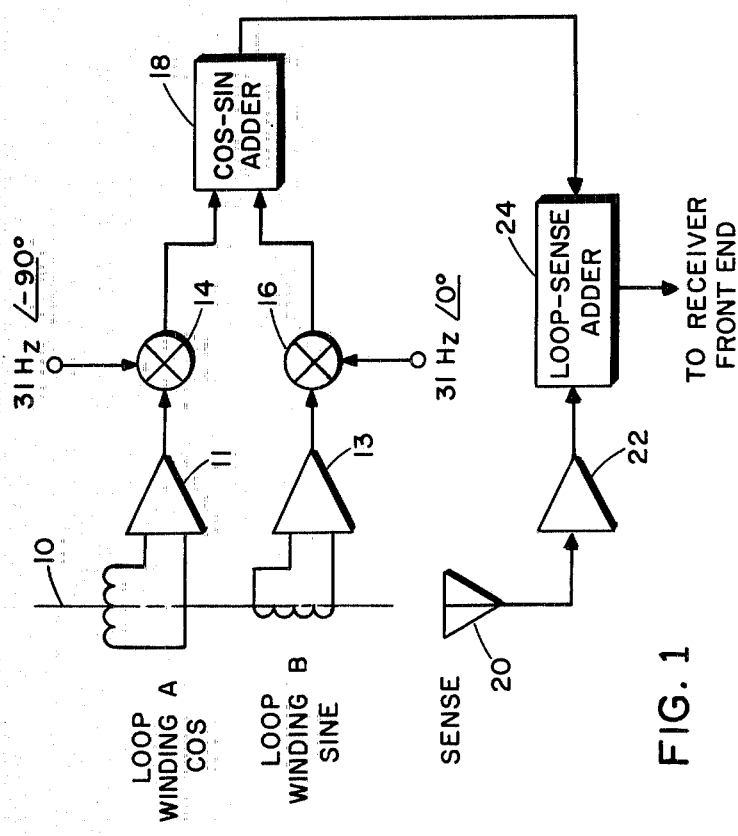
FIG. 1 is a block diagram of a typical ADF antenna circuit.

Referring to the figures wherein like numerals refer to like elements and referring particularly to FIG. 1, an aircraft ADF antenna circuit is seen to be comprised of a loop antenna having a winding A, which is arranged to have its longitudinal axis perpendicular to the aircraft, here indicated as numeral 10, and a winding B which is perpendicular to winding A. The windings are wound mutually perpendicular on a square ferrite bar (not shown). As known to those skilled in the art, the relative amplitude of the signal induced in winding A by a remote broadcast station is related to the sine of the angle between the aircraft heading and the station, while the relative amplitude of the signal induced in winding B is related to the cosine of the same angle. In other words, winding A has peak voltage induced when the received station is straight ahead or straight behind and minimum voltage when the staton is 90 degrees to the right or left of the aircraft. Winding B has peak voltage induced when the station is 90 degrees to the right or left and minimum voltage when the station is straight ahead or straight behind the aircraft. If the aircraft (attached ADF antenna) is rotated through 360 degrees, the voltages across the two windings rise and fall according to the angle between the aircraft heading and station direction.

The signals induced by the received station signal in windings A and B are applied, respectively, through balanced preamplifiers 11 and 13 to balanced modulators 14 and 16. A 31 hertz square wave is also applied to balanced modulator 16 and the same 31 hertz square wave delayed by 90 degrees is applied to balanced modulator 14. It is known to those skilled in the art that a balanced modulator, such as modulator 14 or 16, passes an RF input signal to its output terminal without phase reversal when the square wave modulation input is positive, but reverses the phase of the RF input signal when the modulation input is negative.

The modulated signals from modulators 14 and 16 are combined in adder 18 to produce an RF signal which includes complete information as to the direction of a received signal with a 180 degree ambiguity.

An omnidirectional sense antenna 20 is required to resolve the 180 degree ambiguity which exists in the loop antenna signal. The sense antenna signal is amplified by balanced preamplifier 22 and is added to the signal from adder 18 in loop-sense adder 24 to produce an RF signal which is phase modulated with complete station direction information. The signal from adder 24 is transmitted to the ADF receiver front end where it is processed to remove the station direction information. Receivers for extracting this direction information are well known to those skilled in the art and do not comprise a portion of the present invention, therefore, the receiver need not and is not described here. It is sufficient to note that it is desirable for undistorted information transmission to the receiver front end, that the signal from preamplifier 22 be phase displaced by 90 degrees from the signal from adder 18 across the entire frequency band of interest.

Figure 2:
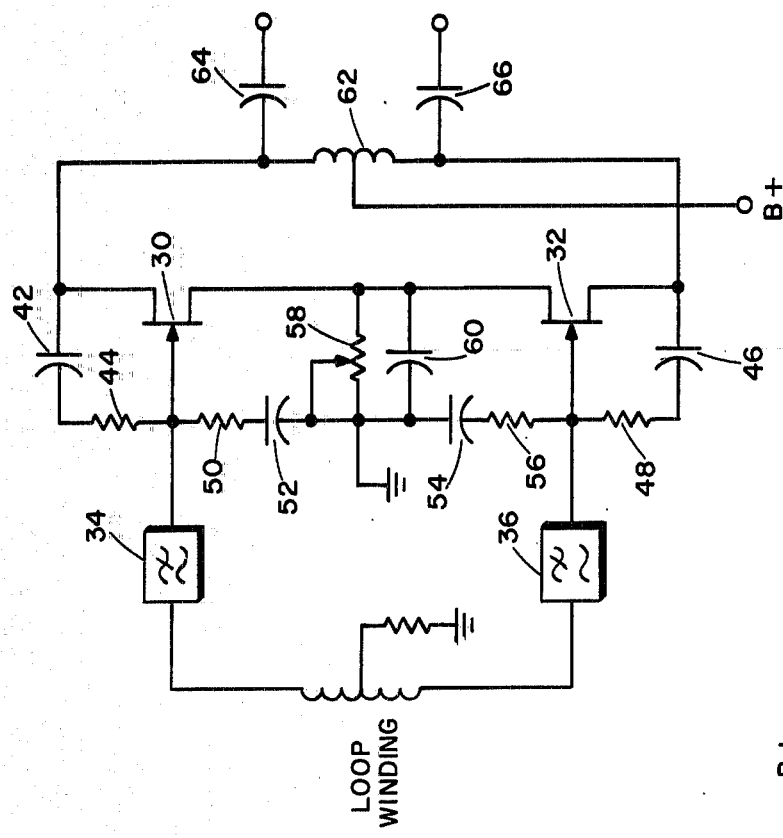
FIG. 2 is a schematic of a typical preamplifier built in accordance with the principles of this invention and which is particularly adapted for use in the antenna circuit of FIG. 1.

Refer now to FIG. 2 which shows a schematic of a preamplifier suitable for use, for example, as the preamplifier 11 or 13 of FIG. 1. This particular preamplifier had a differential input impedance of 2,000 ohms at 600 kilohertz, where 600 kilohertz is approximately the mean of the working frequency band. Actually, the operating range of the loop winding was 200 kilohertz to 1.8 megahertz, the present normal ADF operating range.

The preamplifier is basically a push-pull circuit suitably comprised of low noise transistors such as FET or JFET transistors 30 amd 32 having the loop winding connected across the input or gate electrodes in series with low pass filters 34 and 36, which eliminates high frequency communication channels from the preamplifier circuit. Two shunt circuits comprising respectively a resistor 50 and capacitor 52 and resistor 56 and capacitor 54 connect the gate electrodes of the various transistors to ground eliminating high frequency instability which might cause oscillation problems in the push-pull amplifier. In addition, a capacitor 60 connected between the common or source electrodes of the transistors and ground provides an AC ground by-pass. Capacitors 42 and 46 in the output-input or drain-gate feedback circuit of the various transistors are merely DC blocking capacitors.

The preamplifier input impedance is basically set by the gain of the preamplifier and the value of the drain-gate feedback resistors 44 and 48. The preamplifier gain is set by means of adjustable resistor 58. Assuming the resistance of resistor 44 is equal to the resistance of resistor 48, as is preferable, the preamplifier input impedance is equal to twice the value of one of the resistances times the reciprocal of one plus the preamplifier gain. In a circuit actually built resistors 44 and 48 were each respectively equal to 15K ohms and the preamplifier gain was adjusted to 14 making the differential input impedance equal to 2,000 ohms.

As was previously explained, preamplifier 11 of FIG. 1 is adjusted to be identical to preamplifier 13, which of course is accomplished by using similar components and through the manipulation of variable resistor 58. The push-pull preamplifier output is taken across winding 62 having a B+ center tap and capacitively coupled through a coupling network comprised of capacitors 64 and 66 to the next stage, which in FIG. 1 is seen to be comprised of modulator 14 in the case of loop winding A and of modulator 16 in the case of loop winding B.

Figure 3:
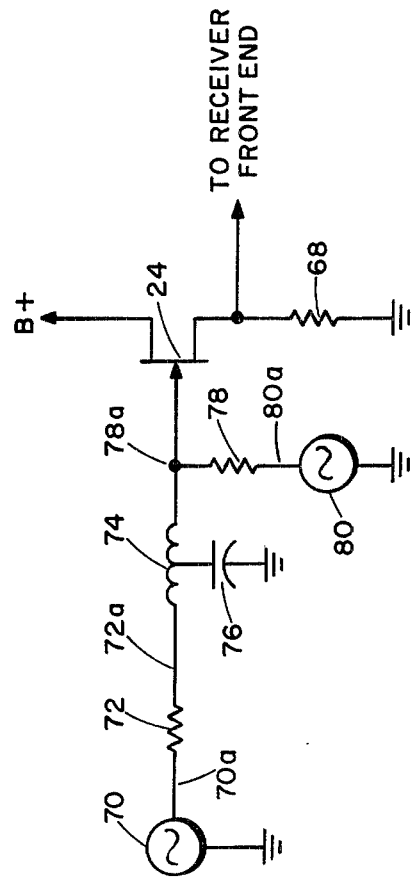
FIG. 3 is a schematic of a sense antenna preamplifier which is suitable for use in the antenna circuit of FIG. 1.

Returning now to FIG. 1, it can be seen that the output signals from modulators 14 and 16, which comprise the output from the ADF loop antenna, are combined in a cosine/sine adder 18. The cosine/sine adder 18 comprises simply a common terminal to which the outputs of modulators 14 and 16 are both impressed as known to those skilled in the art. It will also be remembered that the combined signal from adder 18 is now to be added to the sense antenna signal from preamplifier 22 in loop-sense adder 24. Also, as previously discussed, it is important that the sense signal lag the combined loop signal by 90 degrees over the entire frequency band of interest. How this is accomplished is explained with respect to FIG. 3, reference to which figure should now be made. In that figure JFET transistor 24 basically comprises adder 24 of FIG. 1 having a drain electrode connected to the B+ voltage source and a source electrode connected through resistor 68 to the return electrode or ground. The sense antenna is represented by voltage source 70 and an impedance 72, while the loop antenna and its associated circuitry is represented by voltage source 80 and an impedance 78. It is of course desired that the sense and loop signal at the gate electrode of transistor 24 be 90 degrees out of phase with respect to one another across the frequency band of interest and in particular at a frequency f of 600 kilohertz. This will be true if:

$$R_{72} = R_{78} = 2X_{C76}$$

and $$f = 1/\pi\sqrt{L_{74}C_{76}}$$

where $Y_n$ represents the value of element n for example, $R_{72}$ represents the resistance of resistor 72, $C_{76}$ represents the capacitance of capacitor 76 and $X_{C76}$ represents the reactance of capacitor 76.

If these conditions are met then the phase angle of the sense signals at point 78a and the gate of transistor 24, will be equal to:

$$-2\tan^{-1} \pi R_{72} C_{76} f$$

where f is the signal frequency.

In addition, the amplitude of the signals at point 78a will be constant across the frequency band and the impedance at either end of winding 74, that is, at points 72a and 78a, will have no reactive component.

Having explained and described this embodiment of my invention, I now claim as my property that subject matter covered by the true spirit and scope of the appended claims.

The invention claimed is:

1. In a low noise loop antenna means for use with an automatic direction finder, wherein the loop antenna means is comprised of two orthogonal windings and two preamplifiers, one for each said winding, each said preamplifier comprising: a JFET transistor push-pull circuit having at least first and second JFET transistors having source electrodes connected together; means connecting one said winding across the gate electrodes of said transistors; a resistor feedback circuit connecting respectively the drain electrodes of each of said JFET transistors to its associated gate electrode; and output means connected between the drain electrodes of said first and second JFET transistors, the output signal of said preamplifier being taken across said output means; and including means for adjusting the gain of said preamplifiers to be equal to one another; and additionally including first means for mixing the output signal of one preamplifier with a first square wave of predetermined repetition frequency and second means for mixing the output signal of the other preamplifier with a second square wave of the same predetermined frequency but shifted by 90 degrees in phase with respect to said first square wave.

* * * * *